United States Patent
Lin et al.

(10) Patent No.: US 8,994,097 B2
(45) Date of Patent: Mar. 31, 2015

(54) MOS DEVICES HAVING NON-UNIFORM STRESSOR DOPING

(75) Inventors: Mei-Hsuan Lin, Tainan (TW);
Chih-Hsun Lin, Tainan (TW);
Ching-Hua Chu, Kaohsiung (TW);
Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 289 days.

(21) Appl. No.: 13/415,611

(22) Filed: Mar. 8, 2012

(65) Prior Publication Data
US 2013/0234217 A1   Sep. 12, 2013

(51) Int. Cl.
*H01L 29/66* (2006.01)
*H01L 29/165* (2006.01)
*H01L 29/78* (2006.01)

(52) U.S. Cl.
CPC ........ *H01L 29/165* (2013.01); *H01L 29/66636* (2013.01); *H01L 29/7834* (2013.01); *H01L 29/7848* (2013.01)
USPC ................... 257/327; 257/288; 257/E21.409; 438/199

(58) Field of Classification Search
None
See application file for complete search history.

(56) References Cited

U.S. PATENT DOCUMENTS

| | | | | |
|---|---|---|---|---|
| 7,279,406 B2 * | 10/2007 | Koontz | ......................... | 438/589 |
| 7,538,387 B2 * | 5/2009 | Tsai | .............................. | 257/327 |
| 2008/0246057 A1 * | 10/2008 | Lin et al. | ....................... | 257/190 |

* cited by examiner

*Primary Examiner* — Sonya D McCall Shepard
(74) *Attorney, Agent, or Firm* — Slater & Matsil, L.L.P.

(57) ABSTRACT

A device includes a semiconductor substrate, a gate stack over the semiconductor substrate, and a stressor region having at least a portion in the semiconductor substrate and adjacent to the gate stack. The stressor region includes a first stressor region having a first p-type impurity concentration, a second stressor region over the first stressor region, wherein the second stressor region has a second p-type impurity concentration, and a third stressor region over the second stressor region. The third stressor region has a third p-type impurity concentration. The second p-type impurity concentration is lower than the first and the third p-type impurity concentrations.

20 Claims, 4 Drawing Sheets

MOS DEVICES HAVING NON-UNIFORM STRESSOR DOPING

BACKGROUND

Reductions in the sizes of semiconductor devices (for example, Metal-Oxide-Semiconductor (MOS) devices) have enabled continued improvements in speed, performance, density, and cost per unit function of integrated circuits over the past few decades. In accordance with a design of a transistor, modulating the length of the channel region underlying the gate between the source and drain of a MOS device alters a resistance associated with the channel region, thereby affecting the performance of the transistor. More specifically, shortening the length of the channel region reduces a source-to-drain resistance of the transistor, which, assuming all other parameters are maintained relatively constant, may allow an increase in the current flow between the source and the drain when a sufficient voltage is applied to the gate of the transistor.

To further enhance the performance of MOS devices, stress may be introduced into the channel region of a MOS device to improve its carrier mobility. Generally, it is desirable to induce a tensile stress in the channel region of an n-type MOS (NMOS) device in a source-to-drain direction and to induce a compressive stress in the channel region of a p-type MOS (PMOS) device in a source-to-drain direction.

A commonly used method for applying compressive stresses to the channel regions of PMOS devices is to grow SiGe stressors in the respective source and drain regions. Such a method typically includes the steps of forming a gate stack on a semiconductor substrate, forming spacers on sidewalls of the gate stack, forming recesses in the silicon substrate along the gate spacers, epitaxially growing SiGe stressors in the recesses, and then annealing the substrate. SiGe stressors apply a compressive stress to the channel region, which is located between the source SiGe stressor and the drain SiGe stressor. Similarly, for NMOS devices, stressors that may introduce tensile stresses, such as SiC stressors, may be formed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Metal-Oxide-Semiconductor (MOS) device and the methods of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
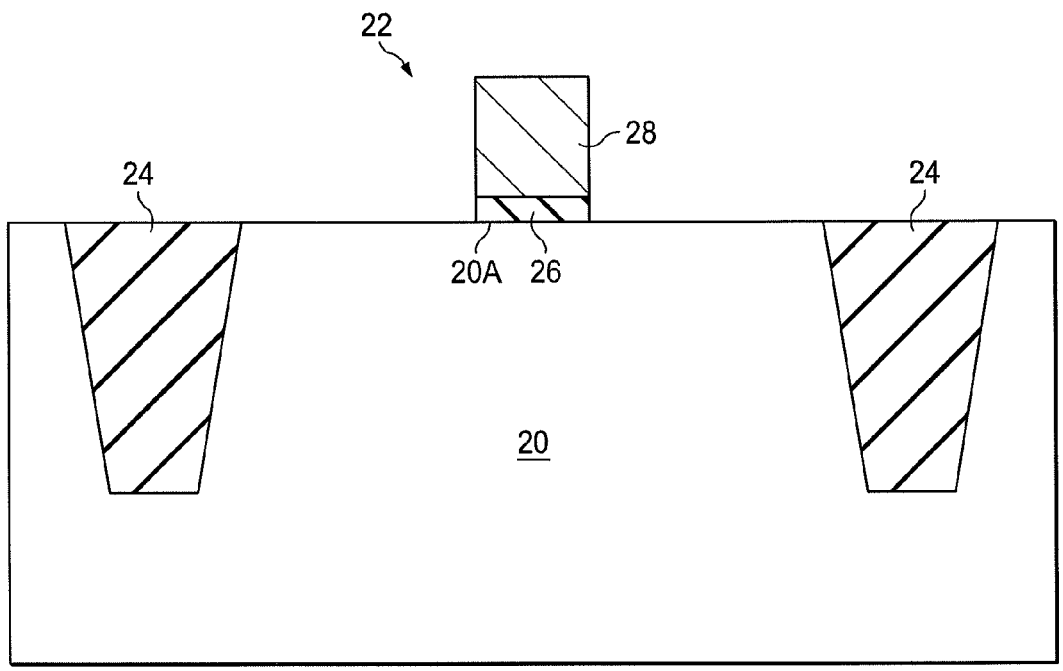
FIGS. 1 through 6B are cross-sectional views of intermediate stages in the manufacturing of a Metal-Oxide-Semiconductor (MOS) device in accordance with some exemplary embodiments.

Referring to FIG. 1, substrate 20 is provided. In an embodiment, substrate 20 is formed of bulk silicon. Substrate 20 may also have a composite structure such as Silicon-On-Insulator (SOI) structure. Shallow Trench Isolation (STI) regions 24 are formed in substrate 20 to isolate device regions. In some embodiments, STI regions 24 may be formed by etching substrate 20 to form recesses, and then filling the recesses with dielectric materials such as high-density plasma oxides.

Gate stack 22, which includes gate dielectric 26 and gate electrode 28, is formed on substrate 20. The interface between gate stack 22 and substrate 20 is referred to as interface 20A hereinafter, which interface is also the top surface of substrate 20. Gate dielectric 26 may have a high dielectric constant (k value), and may include commonly used dielectric materials such as oxides, nitrides, oxynitrides, and combinations thereof. Gate electrode 28 may include doped polysilicon, metals, metal silicides, metal nitrides, and combinations thereof. In some exemplary formation processes, gate dielectric 26 and gate electrode 28 are formed by depositing a gate electrode layer on a gate dielectric layer, and then patterning the gate electrode layer and the gate dielectric layer.

Figure 2:
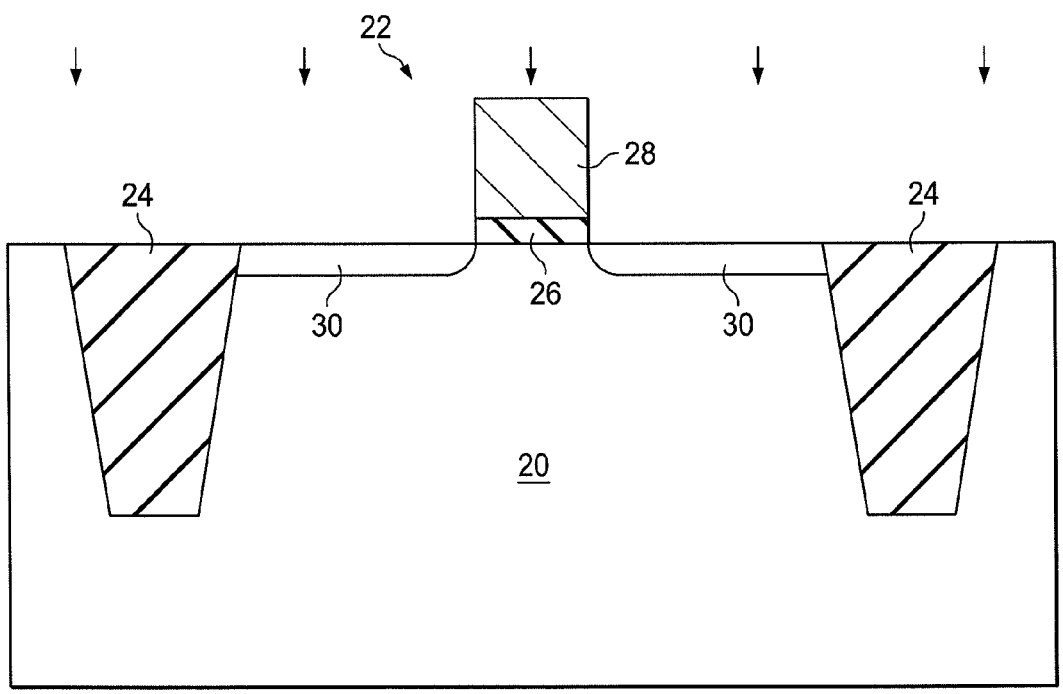

Lightly Doped Drain/source (LDD) regions 30 are then formed, for example, by implanting a p-type impurity, as is shown in FIG. 2. Gate stack 22 acts as a mask so that LDD regions 30 are substantially aligned with the edges of gate stack 22. Halo and/or pocket regions (not shown) may also be formed, for example, by implanting n-type impurities. Alternatively, LDD regions 30 are formed after the stressors are formed, as is discussed in detail in subsequent paragraphs.

Figure 3:
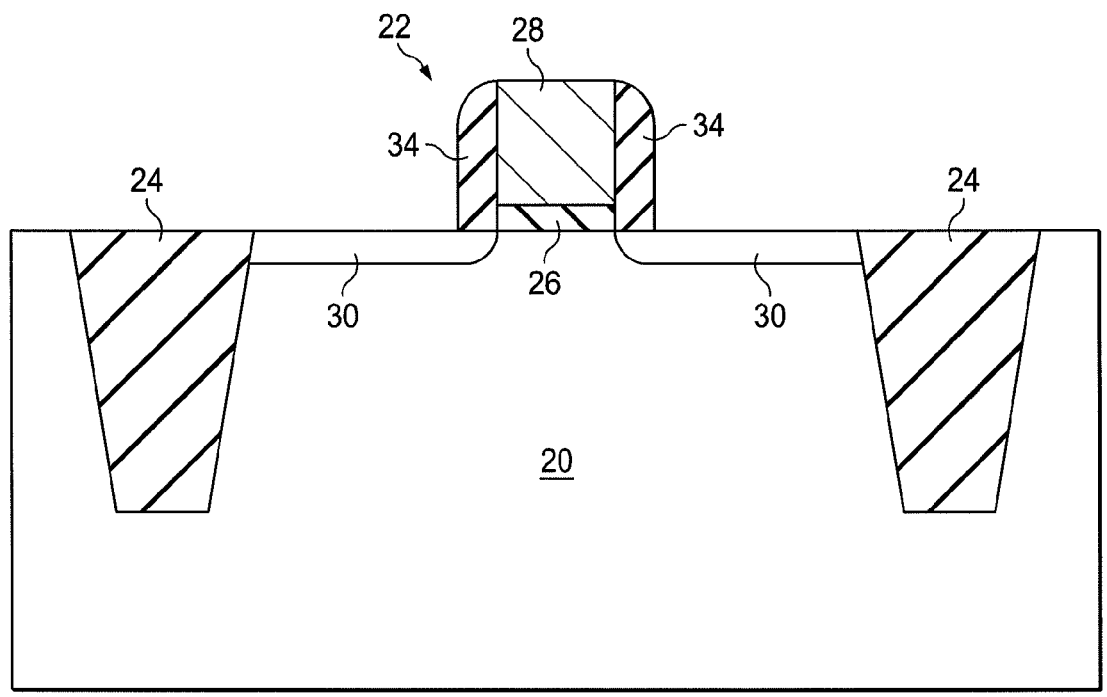

FIG. 3 illustrates the formation of gate spacers 34. In accordance with some embodiments, to form gate spacers 34, a gate spacer layer (not shown) is first formed. The gate spacer layer may include a liner oxide layer and an overlying nitride layer. In alternative embodiments, the gate spacer layer may include a single layer or more than two layers, each comprising silicon oxide, silicon nitride, silicon oxynitride and/or other dielectric materials. The gate spacer layer may be formed using commonly used techniques, such as Plasma Enhanced Chemical Vapor Deposition (PECVD), Low-Pressure Chemical Vapor Deposition (LPCVD), Sub-Atmospheric Chemical Vapor Deposition (SACVD), and the like.

The gate spacer layer is then patterned to form gate spacers 34, wherein the patterning may be performed by dry etching. The horizontal portions of the gate spacer layer are removed, and the remaining portions form gate spacers 34. In some exemplary embodiments, the resulting gate spacers 34 are thin spacers with a thickness between about 150 Å and about 300 Å. One skilled in the art will realize, however, that the dimensions recited throughout the description are examples, and may be changed to different values.

Figure 4:
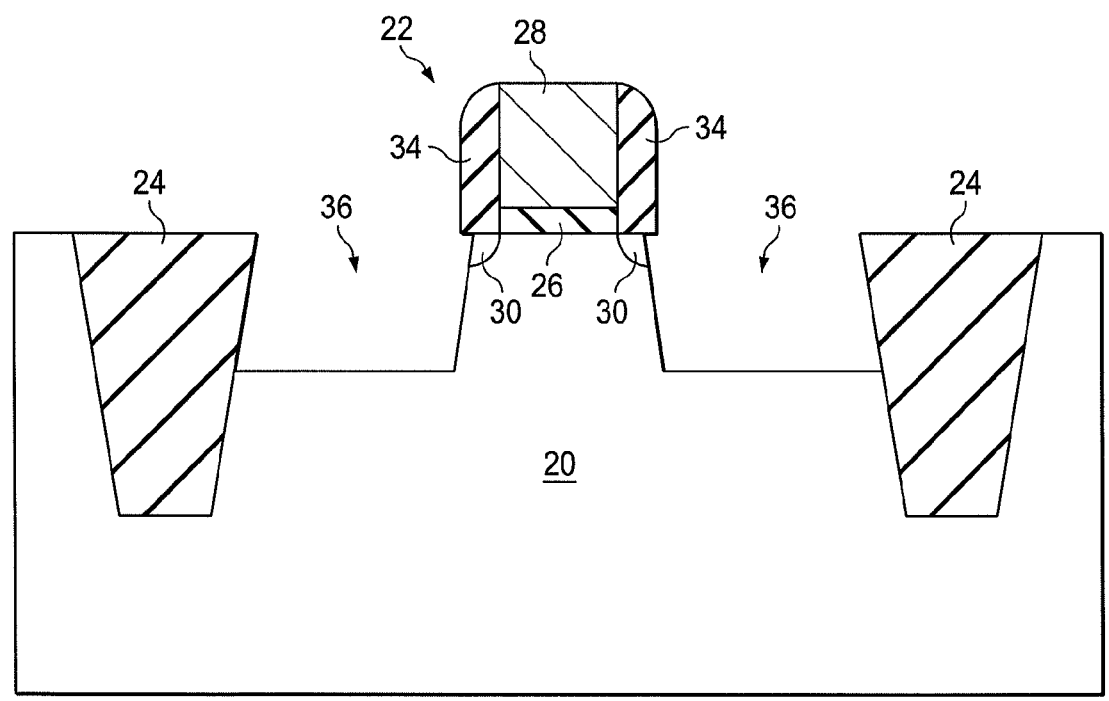

Referring to FIG. 4, recesses 36 are formed along the edges of gate spacers 34. The formation of recesses 36 includes etching substrate 20, either isotropically or anisotropically. The depth of recesses 36 may be between about 500 Å and about 1500 Å in some exemplary embodiments.

Figure 5:
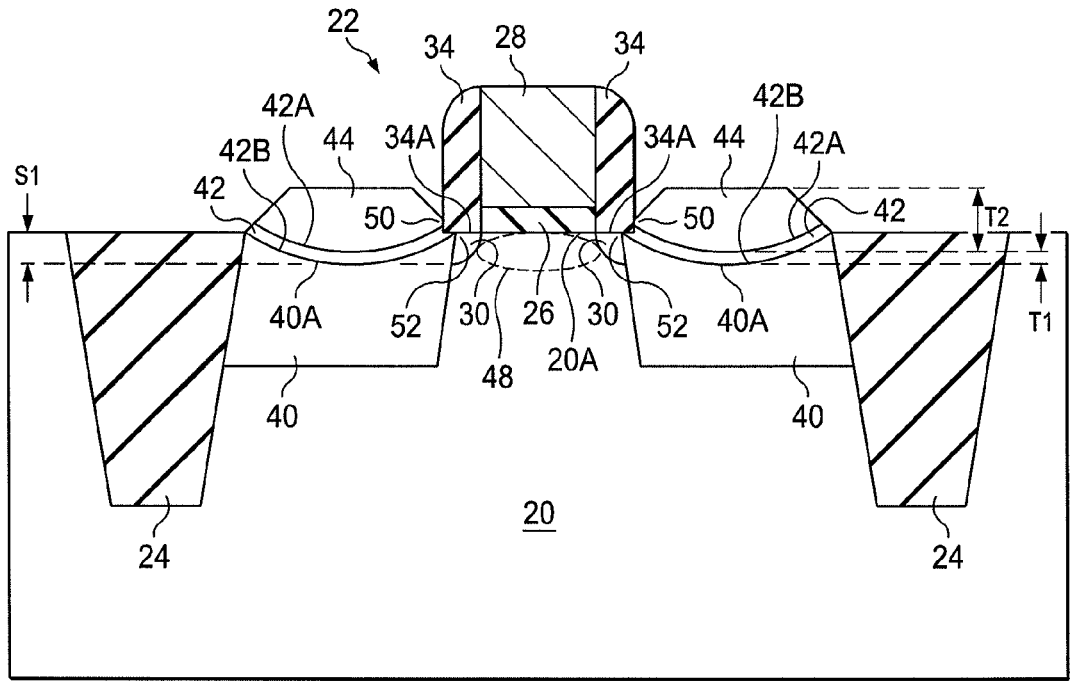

FIG. 5 illustrates the formation of epitaxy regions, which is alternatively referred to as stressors throughout the description. In some embodiments, the stressors are composite stressors having a sandwich structure, with three stacked layers 40, 42 and 44. In the epitaxial process, silicon germanium (SiGe) regions 40 are first epitaxially grown in recesses 36, for example, by Selective Epitaxial Growth (SEG). SiGe regions 40 may have a lattice constant greater than the lattice constant of substrate 20. In some exemplary embodiments, SiGe regions 40 are formed in a chamber using one of the Chemical Vapor Deposition (CVD) methods. The process gases include Si-containing gases and Ge-containing gases, such as SiH$_4$, dichlorosilane (DCS), and GeH$_4$. The partial pressures of the Si-containing gases and Ge-containing gases are adjusted accordingly to modify the atomic ratio of germanium to silicon. P-type impurities, such as boron and/or indium, may be doped at the same time the epitaxial growth of SiGe regions 40 proceeds. Accordingly, the doping is referred to as in-situ doping hereinafter. In some exemplary embodiments, the p-type impurity concentration in SiGe regions 40 is between about $10^{15}$/cm$^3$ and about $10^{17}$/cm$^3$, although a higher or a lower impurity concentration may be used. The in-situ doping of the p-type impurity may be achieved by introducing into the process gas with a boron-containing gas such as BF$_2$ and/or an indium-containing gas.

In some embodiments, SiGe regions 40 have a germanium atomic percentage between about 15 percent and about 40 percent, although the germanium percentage may be higher or lower. Top surfaces 40A of SiGe regions 40 may have a dishing shape, with the central portion of each of SiGe regions 40 being lower than the surrounding portions. In some embodiments, when the epitaxy of SiGe regions 40 is finished, SiGe regions 40 may have a portion higher than interface 20A. Alternatively, substantially entireties of SiGe regions 40 are under interface 20A. In accordance with some embodiments, the vertical distance S1 between the lowest portions of top surfaces 40A and the interface between substrate 20 and gate stack 22 is between about 20 Å and about 100 Å.

Process conditions for the epitaxy process are then changed to form SiGe regions 42 on SiGe regions 40. SiGe regions 42 may not be in-situ doped with p-type impurities when formed. Alternatively, SiGe regions 42 may be lightly doped with p-type impurities. The p-type impurity concentration in SiGe regions 42, however, is lower than the p-type impurity concentration in SiGe regions 40. The p-type impurity concentration in SiGe regions 42 may also be lower than the p-type impurity centration in SiGe regions 42 by one order (ten times), two orders, three orders, or higher. For example, the p-type impurity concentration in SiGe regions 42 may be lower than about $10^{14}$/cm$^3$, and may be substantially equal to zero. The reduction in the p-type impurity concentration in SiGe region 42 may be achieved by turning off, or reducing, the flow of the boron-containing and/or indium-containing gases when SiGe regions 42 are formed. Thickness T1 of SiGe regions 42 may be greater than about 1.5 Å, and may be between about 1.5 Å and about 50 Å.

SiGe regions 44 are then formed on second SiGe regions 42. In some embodiments, the germanium atomic percentage in SiGe regions 44 is lower than that in SiGe regions 40 and/or 42. With a lower germanium atomic percentage in SiGe regions 44, it is easy to form silicides on SiGe regions 44. In some exemplary embodiments, SiGe regions 44 have a germanium atomic percentage between about 10 atomic percent and about 20 atomic percent. Alternatively, the germanium atomic percentage in SiGe regions 44 is substantially equal to that in SiGe regions 40 and/or 42. Thickness T2 of SiGe regions 44 may be greater than about 200 Å, or between about 150 Å and about 250 Å. P-type impurities, such as boron and/or indium, are in-situ doped in SiGe regions 44. In some exemplary embodiments, p-type impurities in SiGe regions 44 have a p-type impurity concentration greater than the p-type impurities in SiGe regions 40 and 42. For example, the p-type impurities in SiGe regions 44 may be between about $10^{17}$/cm$^3$ and about $10^{21}$/cm$^3$, and may further be between about $10^{19}$/cm$^3$ and about $10^{21}$/cm$^3$.

After the formation of SiGe regions 40, 42, and 44, since p-type impurities have been in-situ doped, p-type impurity implantation steps may be omitted, and SiGe regions 40, 42, and 44 form the source and drain regions of the respective MOS device. In alternative embodiments, further implantations may be performed to introduce more p-type impurities into SiGe regions 44, 42, and/or 40.

Since the subsequent process steps include thermal processes, the p-type impurities in SiGe regions 40, 42, and 44 may diffuse to channel region 48 and affect the performance of the respective MOS device. Particularly, boron has a high diffusibility, and may easily diffuse into channel region 48. The performance of the plurality of PMOS devices throughout the respective chip/wafer may have variations due to the non-uniformity in the amount of the p-type impurity diffused into the respective channel regions 48. SiGe regions 44, which are at least lightly doped, and possibly un-doped, may absorb at least some of the diffused p-type impurities, so that the amount of the p-type impurities that are diffused into channel region 48 is reduced. As a result, the variation in the amount of the diffused p-type impurities in the PMOS devices throughout the respective chip/wafer is reduced. The performance variation of the MOS devices, which performance variation is caused by the variation in the diffused p-type impurities, is reduced.

Since SiGe regions 44 have a higher p-type impurity concentration than SiGe regions 40 (and possibly SiGe regions 42, if doped), the p-type impurity diffused from SiGe regions 44 has a greater effect to the performance variation. In some embodiments, SiGe regions 42 are formed between, and separate, SiGe regions 44 and channel region 48, so that the p-type impurity diffused from SiGe regions 44 toward channel region 48 is reduced due to the absorption of the p-type impurity by SiGe regions 42. In some embodiments, top surfaces 42A of SiGe regions 42 intersects with the respective gate spacers 34 at joint points 50, and joint points 50 are higher than bottom surfaces 34A of gate spacers 34. Joint points 50 may also be higher than the interface 20A between substrate 20 and gate stack 22. Furthermore, in some embodiments, bottom surfaces 42B (which are also top surface 40A of SiGe regions 40) of SiGe regions 42 have inner end points 52, which are closer to gate stack 22 than other parts of bottom surface 42B. End points 52 may also be the joint points of bottom surfaces 42B with the respective gate spacers 34, or the joint points with substrate 20. In some embodiments, end points 52 are higher than bottom surfaces 34A of gate spacers 34. In alternative embodiments, end points 52 are level with or lower than bottom surfaces 34A of gate spacers 34. After the subsequent thermal processes, although the p-type impurity diffuses, the p-type impurity concentration in SiGe regions 42 may still be lower than the p-type impurity concentration in SiGe regions 40, which may further be lower than the p-type impurity concentration in SiGe regions 44.

Figure 6A:
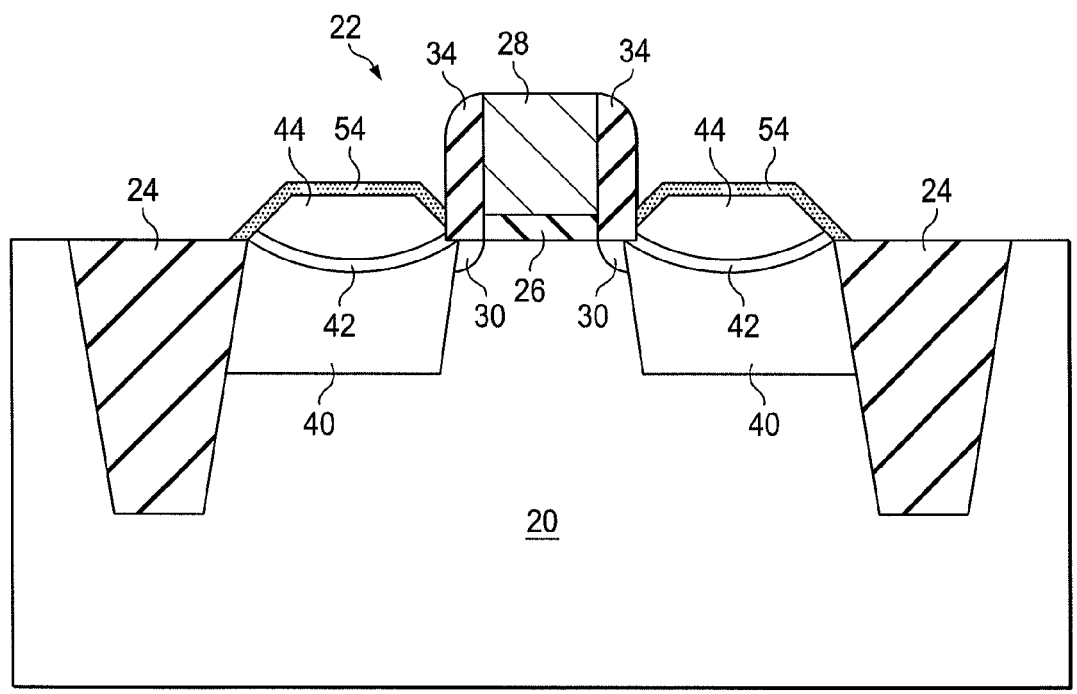
Figure 6B:
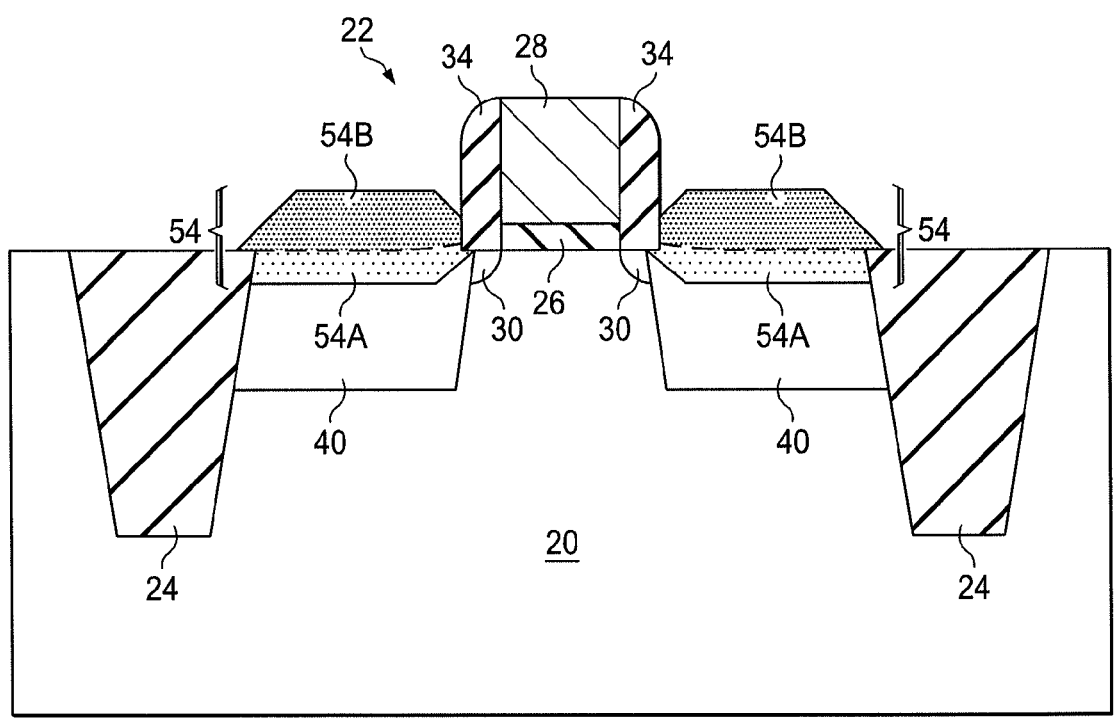

FIGS. 6A and 6B illustrate the formation of germano-silicide regions 54. Throughout the description, germano-silicide regions 54 are also referred to as silicide regions 54. Silicide regions 54 may be formed by blanket depositing a thin layer of metal, such as nickel, platinum, cobalt, and combinations thereof. The substrate is then heated, which causes silicon and germanium to react with the metal where contacted. After the reaction, a layer of metal silicide and/or metal germano-silicide is formed between the silicon/germanium and the metal. The un-reacted metal is selectively removed through the use of an etchant that attacks metal but does not attack silicide and germano-silicide.

In some embodiments, as shown in FIG. 6A, the silicidation process consumes a top portion of each of SiGe regions 44, and the respective bottom portions of SiGe regions 44 are not consumed. In other embodiments, substantially all SiGe regions 44 are consumed, and SiGe 42 remain not silicided. In yet other embodiments, as also shown in FIG. 6B, SiGe regions 42 are consumed. Some top portions of SiGe regions 40 may also be silicided along with the overlying SiGe regions 42 and 44. Alternatively, SiGe regions 42 are consumed, and no SiGe regions 40 are consumed.

As a result of the difference in the p-type impurity concentrations in SiGe regions 40, 42, and 44, the resulting silicide regions may also have different doping concentrations. For example, referring to FIG. 6B, if SiGe regions 42 and 44 are silicided, each silicide regions 54 may include lower portion 54A corresponding to, and are silicided from, the respective SiGe region 42. Each silicide regions 54 may also include upper portion 54B over lower portion 54A, wherein upper portion 54B corresponds to, and is silicided from, the respective SiGe region 44. As a result, upper portions 54B of silicide regions 54 have p-type impurity concentrations higher than the p-type impurity concentrations in lower portions 54A.

In the previously discussed embodiments, the epitaxial regions are formed without the help of dummy gate spacers. In alternative embodiments, after the formation of the epitaxy regions 40, 42 and 44, and before the silicidation, gate spacers 34 are removed, and new gate spacers are formed. The new gate spacers may be wider than gate spacers 34. In these embodiments, the etching for forming recesses 36 (refer to FIG. 4) may be isotropic or anisotropic. LDD regions may be formed after the formation of regions 40, 42 and 44 and the removal of the dummy gate spacers.

In the embodiments, by introducing an un-doped or a lightly doped SiGe region between an overlying SiGe region and an underlying SiGe region, the p-type impurities that are diffused into the channel region of the respective PMOS device is reduced. This results in the reduction in the variation in the device performance.

In accordance with embodiments, a device includes a semiconductor substrate, a gate stack over the semiconductor substrate, and a stressor region having at least a portion in the semiconductor substrate and adjacent to the gate stack. The stressor region includes a first stressor region having a first p-type impurity concentration, a second stressor region over the first stressor region, wherein the second stressor region has a second p-type impurity concentration, and a third stressor region over the second stressor region. The third stressor region has a third p-type impurity concentration. The second p-type impurity concentration is lower than the first and the third p-type impurity concentrations.

In accordance with other embodiments, a device includes a semiconductor substrate, a gate stack over the semiconductor substrate, and a SiGe region having at least a portion in the semiconductor substrate and adjacent to the gate stack. The gate stack and the SiGe region are portions of a MOS device. The SiGe region includes a first SiGe region having a first p-type impurity concentration, a second SiGe region over the first SiGe region, wherein the second SiGe region has a second p-type impurity concentration lower than the first p-type impurity concentration, and a third SiGe region over the second SiGe region. The third SiGe region has a third p-type impurity concentration higher than the first p-type impurity concentration. The second SiGe region is disposed between the third SiGe region and a channel region of the MOS device.

In accordance with yet other embodiments, a method includes forming a gate stack over a semiconductor substrate, and etching the semiconductor substrate to form a recess adjacent to the gate stack. A first epitaxy is performed to grow a first SiGe region in the recess, with a p-type impurity in-situ doped to a first p-type impurity concentration. A second epitaxy is performed to grow a second SiGe region over the first SiGe region. After the step of performing the second epitaxy, the second SiGe region has a second p-type impurity concentration lower than the first p-type impurity concentration. A third epitaxy is performed to grow a third SiGe region over the second SiGe region, with a p-type impurity in-situ doped to a third p-type impurity concentration higher than the first p-type impurity.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a semiconductor substrate;
a gate stack over the semiconductor substrate;
a gate spacer on an edge of the gate stack; and
a stressor region having at least a portion in the semiconductor substrate and adjacent to the gate stack, wherein the stressor region comprises:
a first stressor region having a first p-type impurity concentration;
a second stressor region over the first stressor region, wherein the second stressor region has a second p-type impurity concentration, wherein a bottom surface of the second stressor region has an inner end point closer to a channel region under the gate stack than other portions of the bottom surface of the second stressor region, and wherein the inner end point is level with or higher than the bottom surface of the gate spacer; and
a third stressor region over the second stressor region, wherein the third stressor region has a third p-type impurity concentration, and wherein the second p-type impurity concentration is lower than the first and the third p-type impurity concentrations.

2. The device of claim 1, wherein the second p-type impurity concentration is lower than the first and the third p-type impurity concentrations by at least one order.

3. The device of claim 2, wherein the second stressor region is substantially un-doped with p-type impurities.

4. The device of claim 1, wherein a lowest point of a bottom surface of the second stressor region is lower than an interface between the semiconductor substrate and the gate stack.

5. The device of claim 1 further comprising a silicide region over the third stressor region.

6. A device comprising:
a semiconductor substrate;
a gate stack over the semiconductor substrate; and a silicon germanium (SiGe) region having at least a portion in the semiconductor substrate and adjacent to the gate stack, wherein the gate stack and the SiGe region are portions of a Metal-Oxide-Semiconductor (MOS) device, and wherein the SiGe region comprises:
   a first SiGe region having a first p-type impurity concentration;
   a second SiGe region over the first SiGe region, wherein the second SiGe region has a second p-type impurity concentration lower than the first p-type impurity concentration; and
   a third SiGe region over the second SiGe region, wherein the third SiGe region has a third p-type impurity concentration higher than the first p-type impurity concentration, and wherein the second SiGe region is disposed between the third SiGe region and a channel region of the MOS device, wherein the first SiGe region and the second SiGe region have a same germanium percentage.

7. The device of claim 6, wherein the second SiGe region comprises a first portion higher than an interface between the semiconductor substrate and the gate stack.

8. The device of claim 7, wherein the second SiGe region further comprises a second portion lower than the interface between the semiconductor substrate and the gate stack.

9. The device of claim 7, wherein the third SiGe region comprises boron.

10. The device of claim 7, wherein the second SiGe region has a thickness between about 1.5 Å and about 50 Å.

11. The device of claim 7, wherein the second p-type impurity concentration is lower than the first and the third p-type impurity concentrations by at least one order.

12. The device of claim 11, wherein the second SiGe region is substantially un-doped with p-type impurities.

13. A device comprising:
   a silicon substrate;
   a gate dielectric over the silicon substrate, wherein the silicon substrate and the gate dielectric form an interface;
   a gate electrode over the gate dielectric;
   a gate spacer on a sidewall of the gate electrode, with a bottom surface of the gate spacer contacting the silicon substrate; and
   a source/drain region comprising:
      a first silicon germanium region in the silicon substrate, with an entirety of the first silicon germanium region lower than the interface, wherein the first silicon germanium region has a first p-type doping concentration, and the first silicon germanium region comprises a curved top surface;
      a second silicon germanium region over the first silicon germanium region, wherein the second silicon germanium region has a second p-type doping concentration, and the second silicon germanium region comprises a portion higher than the interface, and a portion lower than the interface; and
      a third silicon germanium region over the second silicon germanium region, wherein the third silicon germanium region has a third p-type doping concentration, with the second p-type doping concentration being lower than the first p-type doping concentration and the third p-type doping concentration, wherein the third silicon germanium region has a germanium percentage lower than a first germanium percent in the first silicon germanium region and a second germanium percent in the second silicon germanium region.

14. The device of claim 13 further comprising a silicide region over the third silicon germanium region.

15. The device of claim 13, wherein the third p-type doping concentration is higher than both the first p-type doping concentration and the second p-type doping concentration.

16. The device of claim 13, wherein a top surface of the second silicon germanium region joins the gate spacer at a level higher than the bottom surface of the gate spacer.

17. The device of claim 6, wherein the first SiGe region, the second SiGe region, and the third SiGe region have a same germanium percentage.

18. The device of claim 1, wherein the first stressor region and the second stressor region have a same germanium percentage.

19. The device of claim 18, wherein the first stressor region, the second stressor region, and the third stressor region have the same germanium percentage.

20. The device of claim 1, wherein the first stressor region comprises a curved top surface.

* * * * *